United States Patent [19]

Miura

[11] 4,012,643

[45] Mar. 15, 1977

[54] NOISE ELIMINATION CIRCUIT

[75] Inventor: Hideki Miura, Tokyo, Japan

[73] Assignee: Sony Corporation, Tokyo, Japan

[22] Filed: Apr. 21, 1975

[21] Appl. No.: 569,889

[30] Foreign Application Priority Data

Apr. 25, 1974 Japan .............................. 49-46944

[52] U.S. Cl. .............................. 307/237; 307/264; 328/165; 328/169; 178/DIG. 12; 357/23; 357/34

[51] Int. Cl.² ........................................ H03K 5/08

[58] Field of Search .......... 307/237, 264, 299, 304; 357/23, 14, 33, 34; 328/171, 169, 165, 162; 178/DIG. 12

[56] References Cited

UNITED STATES PATENTS

| | | | |
|---|---|---|---|
| 3,204,160 | 8/1965 | Sah ...................................... | 357/23 |
| 3,268,658 | 8/1966 | Schroeder .......................... | 357/23 |
| 3,289,009 | 11/1966 | Gruodis ............................... | 357/23 |

*Primary Examiner*—John Zazworsky
*Assistant Examiner*—Marcus S. Rasco
*Attorney, Agent, or Firm*—Hill, Gross, Simpson, Van Santen, Steadman, Chiara & Simpson

[57] ABSTRACT

A noise elimination circuit utilizing a novel four-terminal semiconductor device having an emitter-grounded current amplification factor which rises steeply from a low point to a constant level portion. The input signal which contains desirable signal portions and undesirable noise portions are applied to both the base and the gate of the four-terminal device. The four-terminal device is biased at its gate in such a manner that the desirable signal portions are positioned in the vicinity of the constant level segments of the emitter-grounded current amplification factor, and the high level portions or undesirable portions of the signal are positioned in such a manner to be at the low point on the emitter-grounded current amplification characteristic whereby the desired signal is left unchanged and the undesirable signal is greatly reduced in amplitude at the output of the system.

7 Claims, 9 Drawing Figures

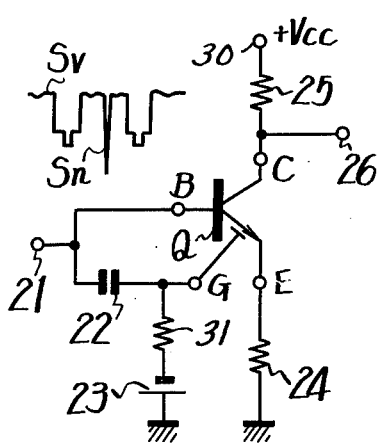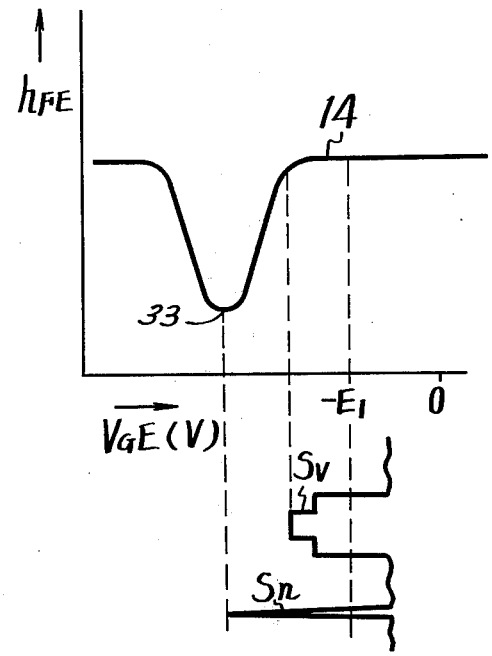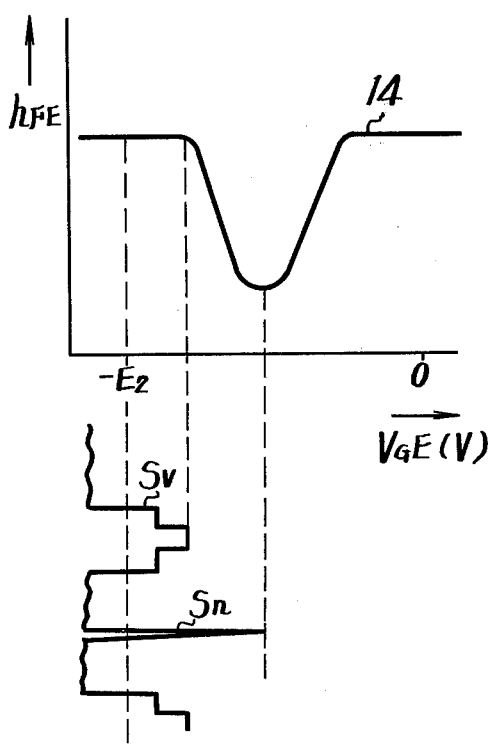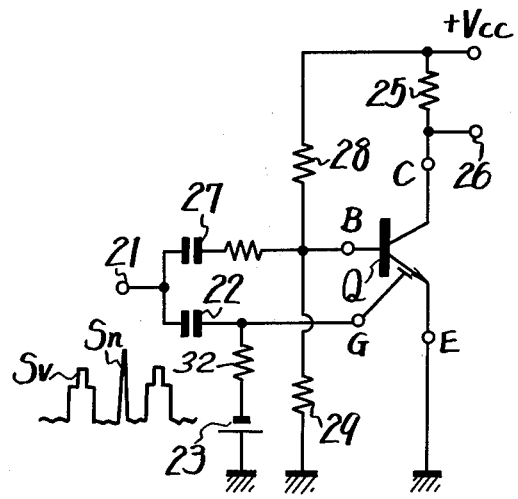

NOISE ELIMINATION CIRCUIT

FIELD OF THE INVENTION

The field of art to which this invention pertains is noise elimination circuits and in particular to circuits utilizing four-terminal semiconductor devices having emitter-grounded current amplification characteristics which rise from a low point to a higher, relatively constant level portion for eliminating noise signals while retaining desired portions of signals.

SUMMARY OF THE INVENTION

It is an important feature of the present invention to provide an improved noise elimination circuit.

It is another feature of the present invention to provide a noise elimination circuit utilizing a novel four-terminal semiconductor device.

It is a principle object of the present invention to provide a noise elimination circuit of the type described above wherein the four-terminal semiconductor device has an emitter-grounded current amplification characteristic which has at least a minimum or low portion and a constant level portion which are connected by a steeply rising segment.

It is also an object of the present invention to provide a novel four-terminal semiconductor gated circuit arrangement for eliminating undesirable noise signals in a desired video signal.

These and other features and advantages of the present invention will be understood in greater detail from the following description and the associated drawing. Reference numerals are utilized to designate a preferred embodiment.

BRIEF DESCRIPTION OF DRAWINGS

FIG. 6, is a simplified illustration of a noise elimination circuit according to the present invention utilizing a four-terminal device as illustrated in FIG. 3.

FIG. 7, shows an emitter-grounded current amplification characteristic similar to that shown in FIG. 5 together with the video signal which is biased at a predetermined level in order to eliminate the undesirable noise portion as to be explained.

FIG. 8, is an embodiment of the present invention similar in its function to FIG. 6 but having the base bias being provided by a resistor connection from the collector supply circuit.

FIG. 9, shows an emitter-grounded current amplification characteristic together with the video signal which is produced in conjunction with the circuit of FIG. 8.

DESCRIPTION OF THE PREFERRED EMBODIMENT

Figure 1:
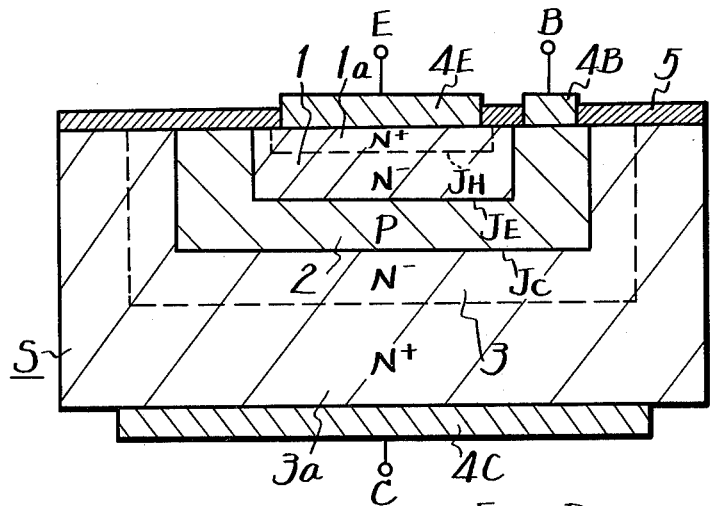
FIG. 1, is an illustration of a three-terminal semiconductor device which forms the basis of the four-terminal device shown in FIG. 3 and utilized in FIGS. 6 and 8.

The present invention relates to a noise elimination circuit utilizing a novel four-terminal semiconductor device having a gate circuit and an emitter-grounded current amplification characteristic which is utilized in the noise elimination process. By applying a desired signal together with an undesired noise signal to the gate of such a device and properly biasing the device the emitter-grounded current amplification curve can be used as a basis for reducing the gain of the device only when the noise is present and keeping the gain at a high level for the desired portions of the signal. This results in a unique system for eliminating the noise only.

DETAILED DESCRIPTION OF THE INVENTION

Novel four-terminal semiconductor devices useable in the invention have high current amplifcation factors, are good in saturation characteristic and low in noise as compared with a prior art bipolar transistor and is constituted by providing a fourth electrode additionally to a body of a novel semiconductor device of the three-terminal type described below.

Before describing the present invention, an embodiment of the novel semiconductor device of the three-terminal type or bipolar transistor will now be described.

The emitter-grounded current amplification factor $h_{FE}$ of a transistor, which is one of parameters evaluating the characteristics of the bipolar transistor, can be expressed by the following equation (1), if the base-grounded current amplification factor of the transistor is taken as $\alpha$.

$$h_{FE} = \frac{\alpha}{1-\alpha} \quad (1)$$

The factor $\alpha$ is expressed as follows:

$$\alpha = \alpha^* \beta \gamma \quad 2$$

where $\alpha^*$ represents the collector amplification factor, $\beta$ the base transfer efficiency and $\gamma$ the emitter injection efficiency, respectively.

Now, if the emitter injection efficiency $\gamma$ of an NPN-type transistor is taken into consideration, $\gamma$ is given by the following expression (3).

$$\gamma = \frac{J_n}{J_n + J_p} = \frac{1}{1 + \frac{J_p}{J_n}} \quad (3)$$

where $J_n$ represents the current density of electrons injected from the emitter to the base of the transistor and $J_p$ the current density of holes injected from the base to the emitter of the transistor, respectively.

Since $J_n$ and $J_p$ are expressed by the following equations (4) and (5), respectively, $$J_n = \frac{qD_n n_p}{L_n} \left\{ \exp\left(\frac{qV}{kT}\right) - 1 \right\} \quad (4)$$

$$J_p = \frac{qD_p p_n}{L_p} \cdot \left\{ \exp\left(\frac{qV}{kT}\right) - 1 \right\} \quad (5)$$

the ratio $\delta$ of $J_n$ and $J_p$ is expressed as follows:

$$\delta = \frac{J_p}{J_n} \cdot \frac{L_n D_p}{L_p D_n} \cdot \frac{p_n}{n_p} \quad (6)$$

where $L_n$ represents the diffusion distance of the minority carriers in the base of the transistor; $L_p$ the diffusion distance of the minority carriers in the emitter of the transistor; $D_n$ the diffusion constant of the minority carriers in the base; $D_p$ the diffusion constant of the minority carriers in the emitter $n_p$ the concentration of the minority carriers in the base under the equilibrium state; $p_n$ the concentration of the minority carriers in the emitter under the equilibrium state; V a voltage applied to the emitter junction of the transistor; k the Boltzmann's constant; T temperature and q the absolute value of electron charge.

If it is assumed that the impurity concentration in the emitter of the transistor is taken as $N_D$ and that in the base of the transistor taken as $N_A$, the term $pn/np$ can be replaced by the term $N_A/N_D$. Further, since $L_n$ is restricted by the base width W and $L_n = W$, the ratio $\delta$ is expressed as follows:

$$\delta = \frac{W}{L_p} \cdot \frac{D_p}{D_n} \cdot \frac{N_A}{N_D} \quad (7)$$

The diffusion constants $D_n$ and $D_p$ are functions of transfer of the carrier and temperature and in this case they are assumed constant substantially.

As may be obvious from the above respective equations, in order to increase the amplification factor $h_{FE}$ of a transistor, it is sufficient to make the ratio $\delta$ small.

Therefore, in an ordinary transistor, the impurity concentration $N_D$ of its emitter is selected high enough so as to make the ratio $\delta$ small.

However, if the impurity concentration of the emitter is selected sufficiently high, for example, more than $10^{19}$ atom/cm$^3$, lattice defects and dislocation occur in the crystal of the semiconductor body of the transistor to deteriorate the crystal. Further, due to the fact that the impurity concentration of the emitter itself is high, a life time $\tau_p$ of the minority carriers injected to the emitter from the base becomes short.

Since the diffusion distance $L_p$ is expressed by the following equation (8)

$$L_p = \sqrt{D_p \tau_p} \quad (8)$$

the diffusion distance $L_p$ of the minority carriers or holes becomes short. Therefore, as may be apparent from the equation (7), $\delta$ can not be made small so much and hence the injection efficiency $\gamma$ can not be made high over a certain value. As a result, the current amplification factor $h_{FE}$ can not be made high so much in the ordinary transistor.

The novel three-terminal semiconductor device is free from the defects mentioned just above inherent to the prior art transistor. As the semiconductor device used in this invention, an NPN-type one and a PNP-type one could be considered as in the case of the prior art transistor, but an NPN-type semiconductor device will be now described with reference to FIGS. 1 and 2, by way of example.

As shown in FIG. 1, the NPN-type three-terminal semiconductor device consists of a first semiconductor region 1 of N$^-$ type conductivity formed in a semiconductor substrate S of N$^+$ type conductivity, a second semiconductor region 2 of P type conductivity formed in the semiconductor substrate S adjacent the first region 1, and a third semiconductor region 3 of N$^-$ type conductivity formed in the substrate S adjacent the second region 2 to form a first PN-junction $J_E$ between the first and second regions 1 and 2 and a second PN-junction $J_c$ between the second and third regions 2 and 3, respectively.

With the semiconductor device shown in FIG. 1, at the position facing the first junction $J_E$ and apart from it by a distance smaller than the diffusion distance $L_p$ of the minority carriers or holes injected from the second region 2 to the first region 1, a potential barrier having energy higher than that of the minority carriers or holes, or at least heat energy is formed in the first region 1. In the example of FIG. 1, the impurity concentration in the first region 1 is selected low sufficiently such as in the order of $10^{15}$ atoms/cm$^3$ and region 1a of N$^+$type conductivity or the impurity concentration of about $10^{19}$ atom/cm$^3$ is formed in the first region 1 to form an LH-junction and hence to form the barrier.

The impurity concentration in the second region 2 is selected in the order of $10^{15} - 10^{17}$ atom/cm$^3$ and that in the third region 3 is selected sufficiently low such as in the order of $10^{15}$ atom/cm$^3$.

In the semiconductor substrate S adjacent to the third region 3 but apart from the second junction $J_c$, there is formed a region 3a of N$^+$ type conductivity and with the impurity concentration of about $10^{19}$ atom/cm$^3$.

A first electrode 4E is formed on the high impurity concentration region 1a in the region 1 in ohmic contact therewith; a second electrode 4B is formed on the second region 2 in ohmic contact therewith; and a third electrode 4C on the high impurity concentration region 3a adjacent the third region 3 in ohmic contact therewith, respectively. From these electrodes 4E, 4B and 4C there are led out first, second and third terminals E, B and C, respectively. In FIG. 1, reference numeral 5 indicates an insulating layer made of, for example, SiO$_2$ and formed on the surface of the substrate S.

The semiconductor device shown in FIG. 1 can be used as a transistor. In such a case, the first region 1 serves as an emitter region; the second region 2 as a base region; and the third region 3 as a collector region, respectively, a forward bias is applied to the emitter junction $J_E$ and a reverse bias is applied to the collector junction $J_c$.

Thus, the holes injected from the base or the second region 2 to the emitter or first region 1 have a long life period of time due to the fact that the emitter region 1 has the low impurity concentraion and good crystal property, and hence the diffusion distance $L_p$ of the holes in the emitter region 1 becomes long. As a result, as may be apparent from the equations (6) and (3), the emitter injection efficiency $\gamma$ can be made high. However, in the case that the diffusion distance $L_p$ is made long, if the injected holes into the emitter region 1 may arrive at the surface of the substrate S and may be recombined with electrons on the surface in practice, the diffusion distance $L_p$ could not be made long substantially. With the semiconductor device in FIG. 1, since the potential barrier is formed in the emitter region 1, which potential barrier faces the emitter junction $J_E$, at the position with a distance smaller than the diffusion distance $L_p$ of the minority carrier, the amount of the surface-recombination is reduced and the diffusion distance $L_p$ can be taken long sufficiently.

Due to the fact that the potential barrier is formed as described above in the example shown in FIG. 1, there is performed such an effect that the current density or component $J_p$ of the holes injected from the base region 2 to the emitter region 1 is reduced. That is, on the LH-junction $J_H$ in the emitter region 1, there is caused a false Fermi level difference or built-in electric field which acts to suppress the diffusion of the holes or the minority carrier. Therefore, if the level of the Fermi level is sufficiently high, the diffusion current caused by the concentration gradient of holes and the drift current caused by the built-in electric field are cancelled on the LH-junction with each other to reduce the hole current $J_p$ injected from the base 2 through the emitter region 1 of low impurity concentration. By this effect, the ratio of electron current arriving at the collector region 3 relative to current component passing through the emitter junction $J_E$ is increased and hence the emitter injection efficiency $\gamma$ is increased as apparent from the equation (3) to make the current amplification factor $h_{FE}$ high.

The above level difference (the height of the potential barrier) must be more than the energy of holes or at least the heat energy. The heat energy can be approximated as kT but the above level difference is desired to be more than 0.1 eV. With the transition region of the potential, the diffusion distance $L_p$ of the holes must not be terminated within the transition region, or it is required that the diffusion distance $L_p$ of the hole must be greater than the width of the transition region.

In the case that LH-junction $J_H$ is formed as shown in FIG. 1, the potential barrier of 0.2eV can be formed by suitably selecting the amount of impurity and gradient of the high impurity concentration region 1a.

Figure 2:
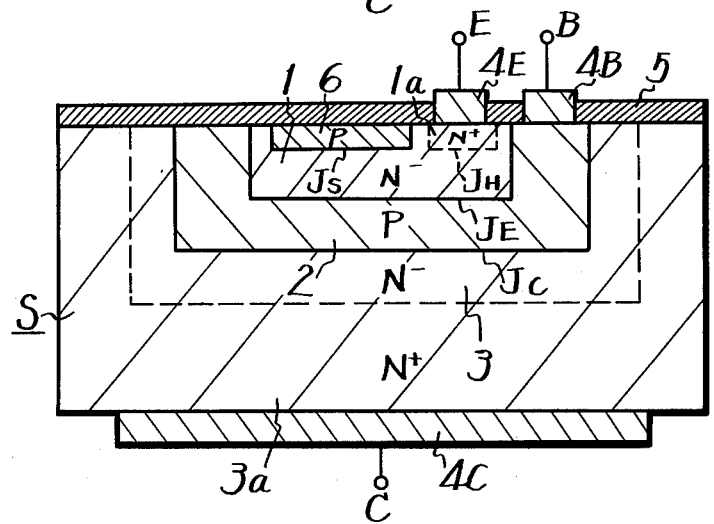
FIG. 2, is an illustration somewhat similar to FIG. 1 showing another embodiment of a three-terminal device.

FIG. 2 shows another example of the three-terminal semiconductor device in which reference numerals and letters same as those used in FIG. 1 indicate the same elements so that their description will be omitted.

In the example of FIG. 2, in order to form a PH-junction $J_S$ facing the first or emitter junction $J_E$, an additional region 6 of P type conductivity is formed in the first region 1. In the example of FIG. 2, the distance between the junctions $J_S$ and $J_E$ is selected smaller than the diffusion distance $L_P$ of the minority carrier in the first region 1. The other construction of the example shown in FIG. 2 is substantially the same as that of the example shown in FIG. 1.

With the example of FIG. 2, since the diffusion distance $L_p$ of the hole injected to the first region 1 is long as described above, the hole arrives at the additional region 6 effectively and then is absorbed thereby. When the additional region 6 is floated from electrical point of view, its potential is increased as the number of holes arriving at the additional region 6 is increased. Thus, the PN junction $J_S$ formed between the regions 6 and 1 is biased forwardly to its rising-up voltage substantially, and then holes will be re-injected to the first region 1 from the additional region 6. Thus, the concentration of holes in the first region 1 near the additional region 6 will be increased, and accordingly the concentration distribution of holes between the junctions $J_E$ and $J_S$ in the first region 1 is made uniform and the gradient thereof becomes gradual to reduce the diffusion current $J_p$ from the second region 2 to the first region 1.

If, in the semiconductor devices described above, a fourth region or control region is formed in the first region 1 thereof and a fourth electrode or control electrode (gate) is connected thereto so as to form a novel four-terminal semiconductor device, its current amplification factor may be varied by applying a control voltage to the control electrode (gate).

Figure 3:
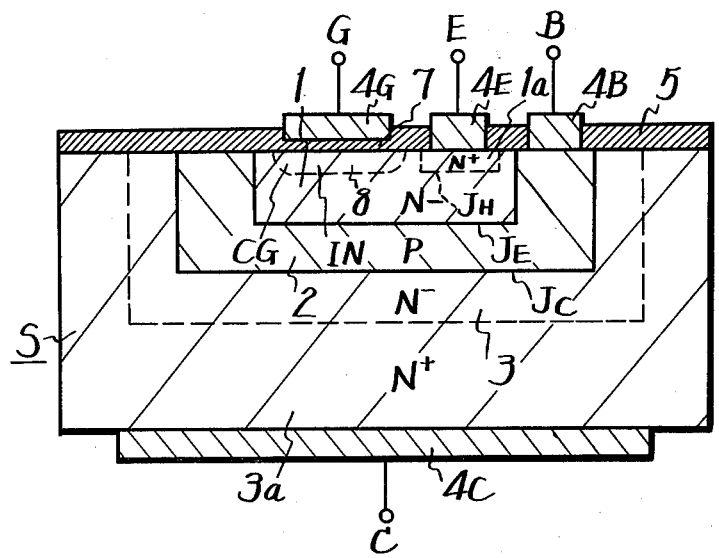
FIG. 3, is an illustration similar to the previous Figures showing a four-terminal device according to the present invention having a gate electrode applied to the first semiconductor region.

A description will be now given on the novel four-terminal semiconductor device which is suitable for use in the invention with reference to FIG. 3 in which a control electrode (gate) is formed on a surface of a part (semiconductor control region) of the first semiconductor region 1 (emitter region) of the semiconductor device of the three-terminal type shown in FIG. 1 through an insulating layer. Therefore, in FIG. 3, elements corresponding to those of FIG. 1 are shown by the same reference numerals and letters and their description will be omitted for the sake of brevity.

In the embodiment of FIG. 3, a control electrode 4G such as a metal layer made of, for example, aluminum and having a predetermined area is formed on a part of the first semiconductor region (emitter region) 1 of the device shown in FIG. 1 through an insulating layer (gate insulating layer) 7 which has a predetermined thickness, for example, 100 A (angstrom), and is made of, for example $S_iO_2$ similar to the insulating layer 5, and corresponds to the gate insulating layer of a MOS FET. A gate terminal G is led out from the control electrode 4G as a fourth terminal. A part 8 in the first region 1 opposing the control electrode 4G is the semiconductor control region.

If a gate bias voltage is applied between the gate and emitter of the four-terminal semiconductor device or the gate terminal G and the emitter terminal E, the current amplification factor or emitter-grounded current amplification factor $h_{FE}$ thereof is varied in response to the gate bias voltage along a curve which is convex in the downward direction and substantially symmetrical with respect to its minimum value. In other words, if a bias voltage which is negative relative to the emitter terminal E in the device of FIG. 3, within the positive range from the threshold voltage of the bias voltage, a storage layer CG havng the function similar to the LH-junction $J_H$ as the potential barrier in FIG. 1 is formed in a part of the first region (emitter region) 1 as the voltage approaches the positive direction. Thus, the current density $J_p$ of the holes of the diffusion current from the second region (base region) 2 to the first region (emitter region) 1 decreases, and consequently the factor $h_{FE}$ increases.

While, within the negative region from the threshold voltage of the bias voltage, an inverse layer IN is formed in a part of the emitter region 1 or control region 8 as the voltage approaches the negative direction and, similar to the case where the additional region 6 in FIG. 2 is floated in electrical point of view, holes are re-injected from the inverse layer IN to the emitter region 1. Thus, the current density $J_p$ of the holes of the diffusion current from the base region 2 to the emitter region 1 decreases, and consequently the factor $h_{FE}$ increases.

Figure 4:
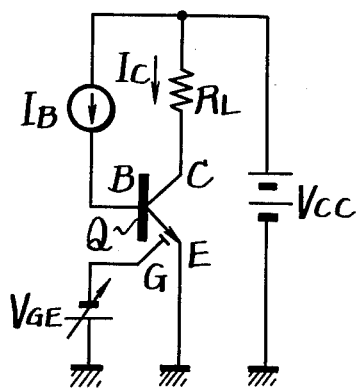
FIG. 4, is a test circuit which may be used to produce an emitter-grounded current amplification curve as shown on FIG. 5. The curve is produced by varying the variable gate-emitter voltage $V_{GE}$.
Figure 5:
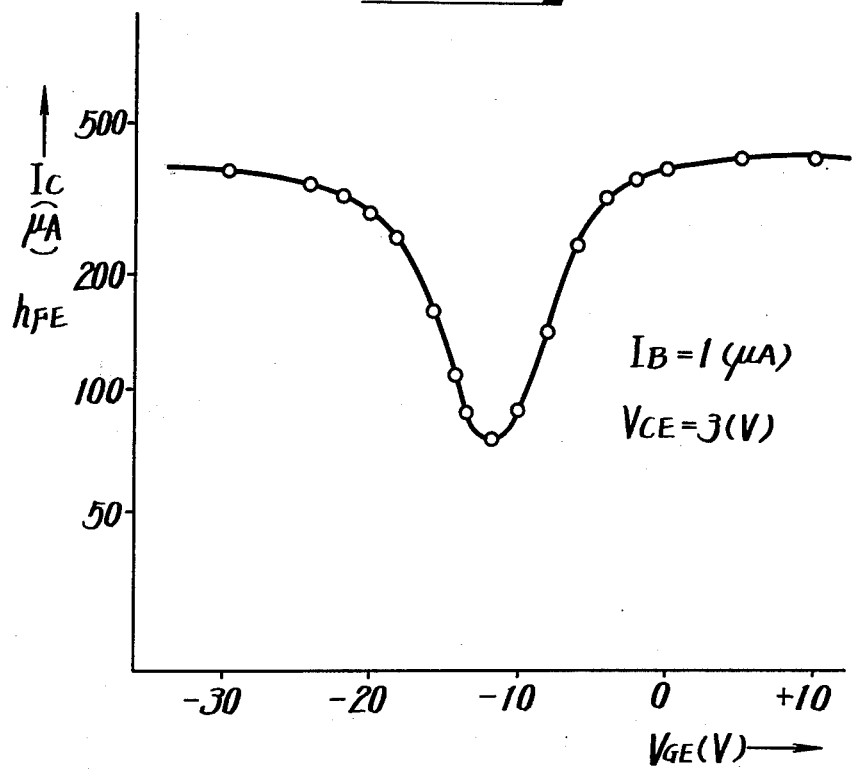
FIG. 5, is an emitter-grounded current amplification characteristic curve produced by circuits such as that shown in FIG. 4.

FIG. 5 is a graph showing the characteristics of the novel four-terminal semiconductor device shown in FIG. 3 which is measured by a measuring circuit shown in FIG. 4.

In FIG. 4, reference letter Q indicates the novel four-terminal semiconductor device shown in FIG. 3 as a symbol, in which a short line is added to the symbol of the prior art bipolar transistor in parallel to its emitter as the gate of the novel four-terminal semiconductor device Q. In FIG. 4, the novel four-terminal semiconductor device Q is shown as an emitter-grounded type. In the figure, reference letter $R_L$ indicates a collector load resistor of the device Q, $V_{CC}$ its collector voltage source, $I_C$ its collector current, $I_B$ its base current (constant), and $V_{GE}$ its gate-emitter voltage, respectively.

When its collector-emitter voltage $V_{CE}$ is 3V (volts) and the base current $I_B$ is $1\mu$ A (micro-ampere), the characteristics of the gate-emitter-voltage (gate bias voltage) $V_{GE}$ (V) - collector current $I_C$ ($\mu$ A) and emitter-grounded current amplification factor $h_{FE}$ are shown in the graph of FIG. 5.

According to the characteristic curve of FIG. 5, it may be understood that the current amplification factor $h_{FE}$ is varied in response to the variation of the gate bias voltage along a curve which is convex in the downward direction and approximately symmetrical with respect to its minimum value (where the gate-emitter voltage is at the above threshold voltage).

When the thickness of the emitter region 1 of the semiconductor device shown in FIG. 3 is selected smaller than the diffusion distance $L_p$ of the holes (injected carriers), the surface recombination, where the gate-emitter voltage $V_{GE}$ is substantially equal to the threshold voltage, influences much. Thus, the life time period of the injected carrier (minority carrier) becomes short, and accordingly the minimum value of the factor $h_{FE}$ can be made small further.

The embodiment shown in FIG. 3 is an NPN type element, but it may be, of course, possible that the semiconductor device is made as a PNP type one as in the case of a bipolar transistor.

In FIG. 6 a simplified version of the present invention is shown, and in this case, a typical video signal which contains undesirable noise is used to illustrate the function of the circuit in illiminating such noise.

The circuit of FIG. 6 has a four-terminal semiconductor device of the type previously described which has a base, B, a collector, C, an emitter, E, and a gate, G. A collector power supply is connected to a terminal 30 through a resistor 25 to the collector. An output terminal 26 is also connected to the collector. The emitter is grounded through a resistor 24.

The video signal is shown as including the normal desirable video portions $S_V$ and the undesirable noise portion $S_N$. This video signal is applied to a terminal 21 which in turn is connected to the base, B, of the four-terminal semiconductor device, it is also connected through a capacitor 22 to the gate, G.

The gate is biased into a predetermined operation state through a resistor 31 and a bias 23 which is then connected to circuit ground.

The operation of the circuit of FIG. 6 is shown in FIG. 7. In FIG. 7 the emitter-grounded current amplification factor or characteristic has a level designated as $h_{FE}$ and is plotted against the gate to emitter voltage $V_{GE}$. In this case, the curve is identified by the numeral 14. As can be seen, the zero point on the curve is to the right of the V-shaped portion. The bias 23 which is applied to the gate terminal is shown as $-E_1$ and the video signal is then applied above the bias to cause the gate voltage to vary in such a manner as to move the operating point of the emitter-grounded current amplification characteristic from the flat constant portion through a steeply inclined portion to a minimum point.

As shown in FIG. 7, the desirable video signal including the well-known pedestal and synchronizing portions are caused to lie on the characteristic curve at the level portion, while the undesirable noise $S_N$ is shown to have its maximum amplitude in the vicinity of the low portion of the characteristic curve. This means that when a noise occurs, the operation of the semiconductor device is quickly shifted to a low gain portion which reduces the relative level of the noise at the output of the circuit. For all practical purposes then, the noise is eliminated.

Referring to FIG. 8, a slightly different arrangement from FIG. 6 is shown. In FIG. 8 the same video signal, however, having opposite polarity is applied to the input terminal 21 which is then connected through a pair of capacitors 22 and 27 respectively to the gate and base terminals of the semiconductor device Q. The base terminal has a connection point which is coupled through a resistor 28 to a collector power supply. The collector power supply, is, of course, connected through a resistor 25 to a collector, C. The output of the circuit is then taken at a circuit terminal 26.

In the case of FIG. 8, the emitter is directly grounded as shown and the gate has a resistor 32 which is connected to a bias supply 23 and then to circuit ground. The function of the circuit is similar to that shown in FIG. 6. However, the location of the signal with respect to the emitter-grounded current amplification characteristic curve 14 is slightly different.

Referring to FIG. 9, the characteristic curve 14 is shown similar to that of FIG. 7. In this case, the entire video signal together with the undesired noise portions are reversed in polarity and are positioned to the left of the low point on the characteristic curve. Here, the voltage which is the bias level for the gate is established at $-E_2$ and as in the case of FIG. 7, the desired pedestal and sync portions of the video signal are retained by being positioned in the vicinity of the relatively flat portion 32 of the characteristic curve, while the undesired noise signal $S_N$ is properly positioned to extend to the low point 33 on the characteristic curve. In this way, the presence of noise causes the gain of the system to be substantially lowered thereby for, all practical purposes eliminating the presence of noise at the output of the system. The gain, however, for the desired signal portions is retained at a high level, and the relative amplitude between the noise and the desired signal is greatly minimized.

I claim as may invention:
1. A noise elimination circuit comprising:
   a semiconductor device comprising a first semiconductor region of one conductivity type,
   a second semiconductor region of the opposite conductivity type adjacent said first region with a first semiconductor junction therebetween,
   a third semiconductor region of the same conductivity type as said first region adjacent said second region with a second semiconductor junction therebetween, first, second and third terminals coupled to said first, second and third regions, respectively, a fourth terminal connected to said semiconductor device and having at least a portion thereof located adjacent to said first region at a position which is spaced from the said first terminal, and an insulating layer separating said fourth terminal from said first region, said first semiconductor region having a control region immediately formed in the vicinity of said fourth terminal, means for applying a signal which has an undesirable noise to said second and fourth terminals, means for applying a bias to one of said first and fourth terminals, said semiconductor device having an emitter grounded current amplification characteristic which varies due to linear changes in voltage between the first and fourth terminals from a predetermined low through a steeply rising segment to a predetermined high at a relatively constant level segment, means for applying a power source to said semiconductor device, means for deriving an output from one of said terminals, and wherein said means for applying a signal with an undesirable noise characteristic comprises means for applying a video signal including a pedastal and a synchronizing portion, means for adjusting the level of said bias such that the entire desired video signal is at a level on the fourth terminal which causes the emitter grounded current amplification to be located at the relatively constant level segment immediately in the vicinity of the steeply rising segment, whereby noise signals which exceed the level of the desired video signal cause the emitter grounded current amplification to be located in the vicinity of the steeply rising segment and the predetermined low portion such that said noise is substantially eliminated at said output.

2. A noise elimination circuit in accordance with claim 1 wherein said bias is caused to maintain the potential of said fourth terminal at a lower level than the potential of said first terminal.

3. A noise elimination circuit in accordance with claim 1 wherein said bias is applied to said fourth terminal.

4. A noise elimination circuit in accordance with claim 1 wherein an additional bias is applied to said second terminal and wherein said output is derived from said third terminal.

5. A noise elimination circuit in accordance with claim 1 wherein said first and third regions of the semiconductor device each have at least a first portion with impurity concentrations of substantially the same order of magnitude and said first region being provided with a second portion having an impurity concentration higher than said first portion of the first region at a position spaced from said first junction by a distance which is smaller than the diffusion distance of the minority carriers.

6. A noise elimination circuit according to claim 1 wherein said pedestal and synchronizing portions of said video signal and said noise signals have negative polarity.

7. A noise elimination circuit according to claim 1 wherein said pedestal and synchronizing portions of said video signal and said noise signals have positive polarity.

* * * * *